US007668053B2

(12) United States Patent
Haddad (10) Patent No.: US 7,668,053 B2
(45) Date of Patent: Feb. 23, 2010

(54) PROCESSING AN INFORMATION CARRYING SIGNAL

(75) Inventor: Bassel Haddad, Haifa (IL)

(73) Assignee: Zoran Corporation, Sunnyvale, CA (US)

( * ) Notice: Subject to any disclaimer, the term of this patent is extended or adjusted under 35 U.S.C. 154(b) by 669 days.

(21) Appl. No.: 10/908,992

(22) Filed: Jun. 3, 2005

(65) Prior Publication Data

US 2006/0274620 A1 Dec. 7, 2006

(51) Int. Cl.
*G11B 7/00* (2006.01)
(52) U.S. Cl. ............................ 369/44.34; 369/44.36
(58) Field of Classification Search ............ 369/44.36, 369/44.34
See application file for complete search history.

(56) References Cited

U.S. PATENT DOCUMENTS

| 5,034,940 | A | * | 7/1991 | Saito et al. ............... 369/44.34 |
| 5,483,513 | A |   | 1/1996 | Fuji |
| 6,091,687 | A | * | 7/2000 | Verboom et al. ......... 369/59.17 |
| 6,600,431 | B1 | * | 7/2003 | Shim et al. ................... 341/59 |
| 6,621,338 | B1 |   | 9/2003 | Van Schyndel |
| 7,427,934 | B2 | * | 9/2008 | Ballweg ....................... 341/50 |
| 2002/0041546 | A1 | * | 4/2002 | Takasaka et al. ......... 369/44.36 |
| 2003/0031099 | A1 |   | 2/2003 | Tsuchinaga et al. |
| 2003/0079161 | A1 |   | 4/2003 | Verboom |
| 2003/0218501 | A1 |   | 11/2003 | Oshima et al. |

FOREIGN PATENT DOCUMENTS

| EP | 0935340 | 8/1999 |
| EP | 1345221 | 9/2003 |
| EP | 1345221 A2 | 9/2003 |
| EP | 1345221 A3 | 12/2007 |
| WO | 97/02656 | 1/1997 |

* cited by examiner

*Primary Examiner*—Wayne Young
*Assistant Examiner*—Van N Chow
(74) *Attorney, Agent, or Firm*—Lando & Anastasi, LLP (57) ABSTRACT

An automatic gain control (AGC) controls the signal amplitude at the input to an analog to digital converter (ADC) input by applying a gain that produces a desired overall amplitude resolution of the patterns actually presented by the signal delivered by the ADC converter. Short RLL patterns will have sufficient resolution for reliable extraction as a result of having sufficient overall amplitude, which thereby strengthens the ability of the read channel to correctly extract data. Moreover, the system determines correct AGC settings responsive to measurements of user data parameters. The system also detects and corrects for DC offsets in the signal whose gain is controlled.

28 Claims, 5 Drawing Sheets

PROCESSING AN INFORMATION CARRYING SIGNAL

BACKGROUND

The invention relates to processing information received over a communication channel, for example, from a data storage system. In particular, the invention relates to systems, methods and apparatuses for the accurate retrieval of data from optical media by controlling the amplitude of a read signal applied to read signal processing apparatus.

Storage technologies have evolved to meet the ever-increasing high capacity data storage needs of consumers and businesses. The creation, storage, use, and retrieval of digital entertainment content and business data are but a few examples of such needs. Although magnetic, optical and magneto-optical technologies have to some extent addressed the current needs related to storage capacity, technologies such as high-definition video generally demand ongoing improvements to the retrieval and processing functions to keep pace with the speed with which the data must be processed to take full advantage of such technologies. Furthermore, imperfections and normal variations in the media as manufactured, as recorded or embossed, or resulting from handling, may introduce unwanted errors. The accurate retrieval and processing of data, in the face of errors caused by scratches, poor recording, micro-scratches, inexpensive disks, high recording densities and other performance characteristics continues to be of concern.

Optical disks such as CD's, DVD's, and newer digital formats such as HD-DVD and Blu-Ray provide numerous benefits over traditional magnetic media such as VHS tapes and diskettes due to their durability and the high data capacities they provide. The significant increase in processing capabilities of even the most inexpensive personal computers, as well as the almost universal acceptance of DVD as the media format of choice has provided consumers with the ability to enjoy movies and other forms of audio-visual entertainment in their homes at both an extremely high quality and at a reasonable cost.

To retrieve information, a conventional optical storage and retrieval device utilizes a solid state laser to illuminate the storage media and detect variations in one or more physical properties of the storage media at a desired location with respect to the disk's surface. For example, for DVD media, marks and spaces are recorded or embossed 0.6 mm below the storage media protective substrate surface as regions of different reflectivity or different depths. New, proposed media types place the marks 0.1 mm below the surface. When data is stored in the form of mark depth, phase interference techniques are employed to convert varying depth into detectable phase variations in the reflected light. The contrast ratio between mark regions and space regions, whether phase differences or reflectivity differences, needs to be sufficiently high to be detectable. The contrast ratio observed is highly dependent on writing conditions and reading conditions, as well as the characteristics of the disk as manufactured. For example, interference techniques rely on phase differences of about 180°, which are the result of mark depths, in such media, of about ¼λ, where "λ" represents the wavelength of the light used to read the mark. For red laser light having a wavelength of about 640 nm, ¼λ is about 160 nm. During reading, the read laser is focused on the marks, so as to detect the 160 nm height difference, while most DVD media surface defects are 0.6 mm away from the marks being detected, and so are well out of focus. The operation and performance of the storage and retrieval device is thus highly dependent upon the properties of the storage media, the condition of the storage media (e.g., dirty, scratched, manufacturing quality, etc.), the properties of the apparatus in which the storage media was recorded or embossed, the precision of the apparatus in which the storage media was recorded or embossed and the properties and precision of the stored data retrieval device.

In optical data storage systems, several factors are coordinated in order to accurately retrieve data from the media, including in some systems, but not limited to, the speed of the disk, delays in electronics, operational characteristics of the laser, the speed of related systems, etc. Consequently, timing clocks are often coordinated or locked together to provide overall control of data timing in storage systems. In addition to timing, gains and offsets of the various electronics are controlled and coordinated so that information read from a disk accurately represents the data recorded or embossed on the disk. Ineffective control and settings can impede the operation of these electronics, and result in retrieved data inaccuracies and the inability to operate properly.

In order to more clearly disclose aspects of the invention, certain terms are now defined, and used as defined throughout this disclosure and claims.

Definition List 1

| Term | Definition |
| --- | --- |
| Saturation level | When applied to an input signal that may assume a variable value, this refers to a value defining a boundary, to one side of which a component acting on the signal acts according to its designed transfer function, and to the other side of which the component enters a limiting operating region. Components frequently exhibit both an upper and a lower saturation level, operating according to the designed transfer function between them. In the case of a stepwise linear component, such as an analog-to-digital converter, the component has a stepwise linear transfer function between two saturation levels and the transfer function becomes non-linear beyond either saturation level. When applied to an output signal, this refers to the value assumed by the output signal when the component producing the output signal is operating in a limiting operating region. |
| Peak-to-peak saturation level | That signal amplitude having peak excursions just touching both upper and lower saturation levels. |
| Non-predetermined information content | Content of a signal that is not determined beforehand. An example of non-predetermined information content is user data. Some examples of predetermined information content include the data defining a sync pattern and header address information. |
| Channel bit (T) | A channel bit (T) in a signal, defined over a span of either space or time, is the spacing in either space or time that defines where transitions defining edges of each symbol represented in the signal can legitimately occur. In some codes, transitions may not fall less than three channel bits apart, but may be three, four, five, . . . channel bits apart, thus the closest difference between symbol lengths is one channel bit (1T). |
| Medium (media) | The physical, information-carrying object(s) through which, or on which, information is communicated or stored. |

-continued

Definition List 1

| Term | Definition |
| --- | --- |
|  | In communication systems, media include, but are not limited to, copper wire and fiber optic materials. In storage systems, media include, but are not limited to, CD disks, DVD disks and the like. |

Figure 1:
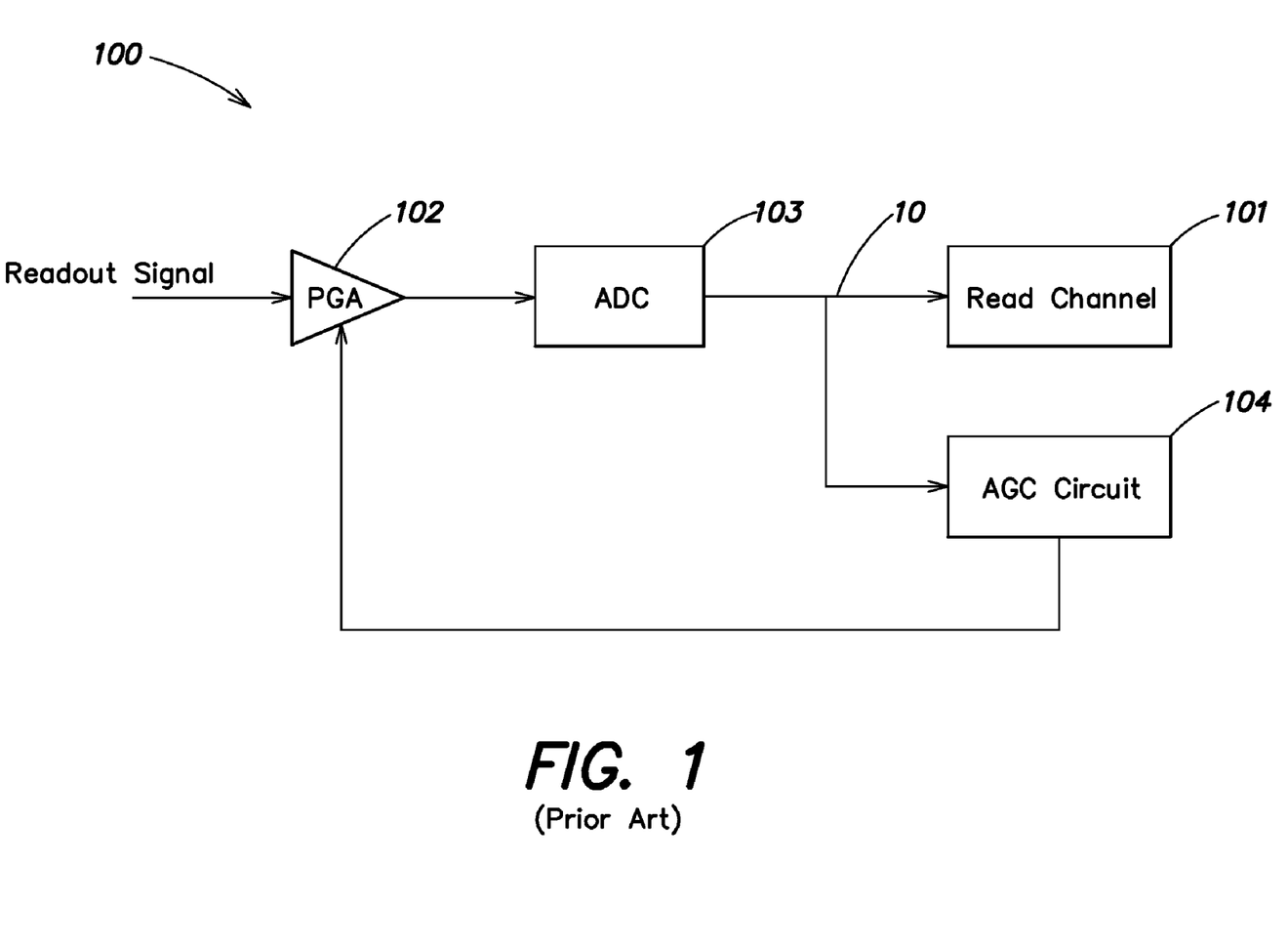
FIG. 1 is a block diagram of a standard optical disk storage AGC system.

Conventional optical disk storage read channels, 101, employ Automatic Gain Control (AGC) systems 100, such as the one depicted in FIG. 1. AGC system, 100, employs a circuit topology known as a feedback connection or closed loop circuit to continuously monitor a signal 10 and to adjust the gain of one or more elements in response to the signal. For example, the AGC system, 100, may include a Programmable Gain Amplifier (PGA), 102, and the AGC system, 100, may be a closed loop circuit including an AGC circuit, 104, that detects the amplitude of an input signal 10 to the read channel, 101, and adjusts the PGA gain to maintain a chosen amplitude of signal 10. Most conventional AGC circuits, 104, measure maximum and minimum signal levels, and ensure that a signal whose amplitude is below the peak-to-peak input saturation level of the downstream components is delivered to those downstream components, such as an analog-to-digital converter (ADC), 103, thus avoiding driving the output signal, 10, of the ADC, 103, into or beyond the output saturation level of the ADC 103.

The AGC system, 100, may have a programmable response time. Time constants of conventional AGC systems, 100, may be on the order of hundreds of channel bits, T, or even longer, making conventional AGC systems, 100, intentionally slow to react, so as to improve the stability of the signal subjected to AGC control.

In conventional optical storage systems employing run-length limited (RLL) modulation, the stored information resides in the pulse width of the RLL modulated signal, rather than in its amplitude. For conventional DVD and CD formats, the RLL modulation pulse widths, as recorded or embossed on the disk and seen in the readout signal, vary between a minimum of three channel bits (3 T) and a maximum of eleven channel bits (11 T) in length. The AGC adjusts gain so as to prevent the ADC's digital output from reaching the saturation level, even on long (e.g., 11 T) symbols, causing extraction accuracy of the data carried by short (e.g., 3 T) symbols to decline as a result of the limited number of ADC quantization levels available to represent the shorter symbols, which have lower amplitudes. Because the time constant of the AGC may be hundreds of channel bits, T, or longer, the AGC is not designed to, and does not react to the rapid changes that occur when a 3 T, or other short symbol is followed by an 11 T, or other long symbol or vice versa.

Figure 3:
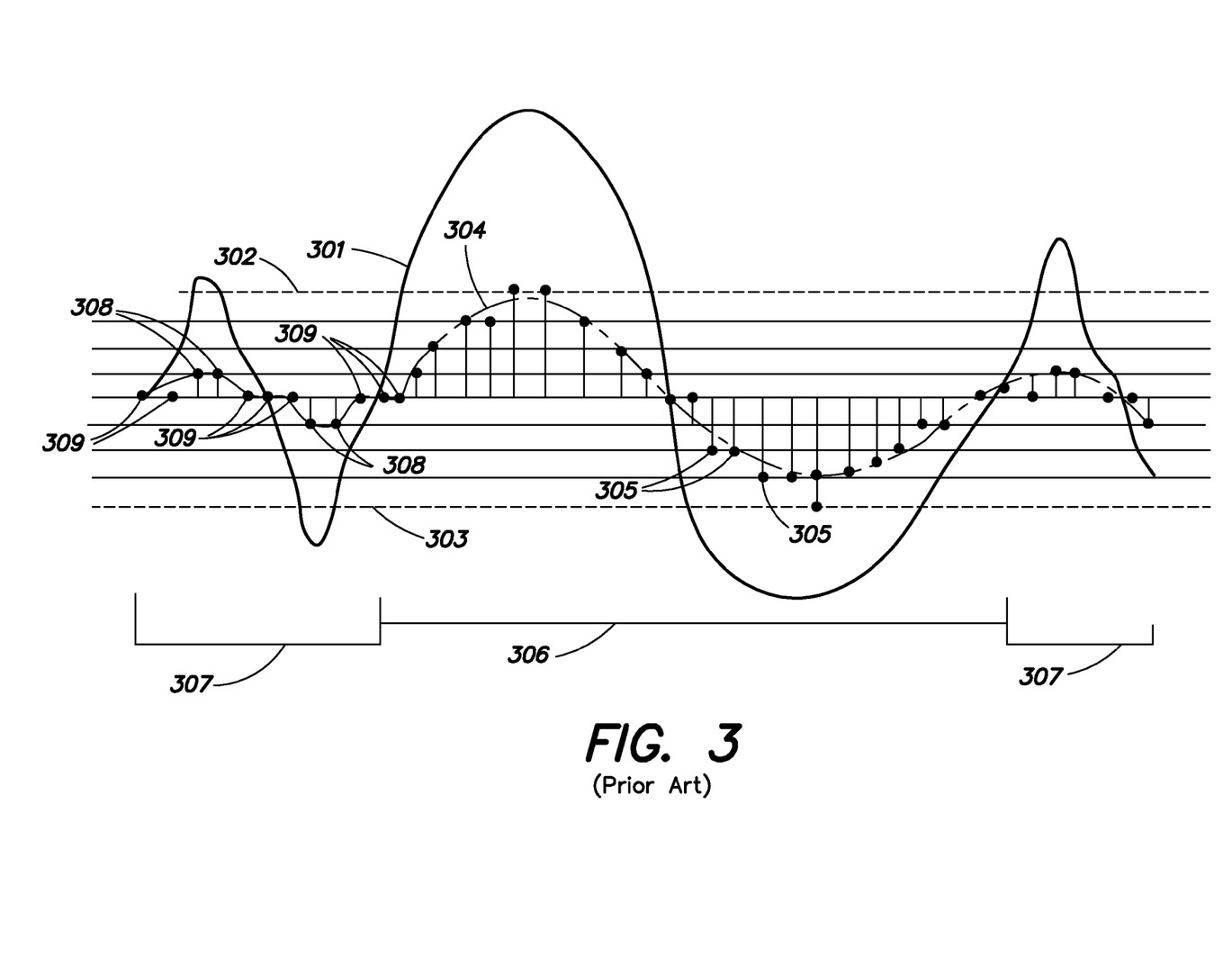
FIG. 3 is an illustration of the input and output signals of a standard optical disk storage AGC system.

The effect of a conventional AGC system on a readout signal is shown in FIG. 3. A readout signal, 301, is determined by the conventional AGC to exceed upper and lower thresholds, 302 and 303. The upper and lower thresholds, 302 and 303, represent the input signal saturation levels for a component (e.g., FIG. 1, ADC, 103) receiving the readout signal, 301. The AGC lowers the gain of a Programmable Gain Amplifier (PGA) through which the readout signal, 301, passes, producing the output signal, 304. The output signal, 304, does not exceed the saturation levels, 302 and 303, anywhere. Ideally, in the conventional AGC, the output signal, 304, just reaches the saturation levels, 302 and 303, but does not exceed the saturation levels, 302 and 303. In practical systems, the peak-to-peak amplitude of the output signal, 304, would be set to some marginally lower amplitude, say 95% of peak-to-peak saturation level, to allow for some variations in the maximum level of the input signal. Because longer pattern symbols are lower frequency waveforms than shorter pattern symbols, and because lower frequencies are less attenuated during transmission as a result of intersymbol interference, longer pattern symbols have higher amplitudes than shorter pattern symbols. The sampled values, 305, which are both sampled in time and quantized to discrete quantization levels by an ADC (e.g., FIG. 1, 103), adequately represent longer pattern symbols, 306, which have high amplitudes, but do not have sufficient quantization resolution to adequately represent shorter pattern symbols, 307, which have substantially lower amplitudes.

As seen in the illustrative example of FIG. 3, for short symbols, 307, samples, 308, in the peak amplitude region are quantized to one level, while in the region of the symbol, 307, near the zero-crossing points, samples, 309, are quantized to another level, in this example, to zero. Because plural samples, 309, in the vicinity of the zero-crossing points are all quantized to one level, in this example zero, the precise location of the zero-crossing point is obscured. In practical systems, samples near the zero-crossing point may be quantized to levels other than zero, but nevertheless close enough to zero that they tend to make accurate interpolation of the time of the zero-crossing point difficult, if not impossible.

Further, conventional AGC approaches cannot respond to defects such as manufacturing surface defects, scratches, fingerprints, smudging, etc., that are shorter than or up to the order of magnitude of the AGC's response time. Furthermore, prior long and high amplitude pattern symbols may result in reduced amplitude resolution of short pattern symbols at the ADC output during normal operation. This effect of poor performance when long patterns are followed by short patterns is exacerbated in the presence of defects. This additionally reduces the read channel's ability to accurately extract data.

Known AGC systems are disclosed in U.S. Patent Application No. 2003-0079161A1, filed by Verboom, U.S. Pat. No. 6,621,338, issued to Van Schyndel, and U.S. Pat. No. 6,091, 687, issued to Verboom et al. U.S. Patent Application No. 2003-0079161A1 discloses a conventional AGC that monitors a special signal carrying predetermined information content specially written in the user data area for the AGC to act upon. U.S. Pat. No. 6,091,687 discloses use of an AGC to control signal levels in communication systems.

SUMMARY OF THE INVENTION

In general, the invention relates to processing data.

While particularly useful for optical media, these methods and tools are not limited to that specific application, and can be used in other applications where digital data is processed. For example, these methods may be used in processing signals derived from magnetic or magneto-optical media or may be used in communications channels employing codes that experience similar channel effects to those experienced when writing signals to and reading signals from storage media (e.g., intersymbol interference). Examples of such communication channels include computer networks, telecommunication systems, telemetry systems and the like, where the maximum data rate in the presence of delay and noise, optimal performance, low cost, or all of the above are desired. In fact, aspects of embodiments of the invention are useful for systems employing pulse-width modulation schemes, such as mentioned, but also useful for any other modulation method which does not encode the information to be communicated in the amplitude or variation in amplitude of the signal. Such modulation schemes include, but are not limited to, phase-shift keying, frequency modulation and the like.

In conventional optical disk read data paths, an Automatic Gain Controller (AGC) unit maintains optimal signal amplitude at selected points, or nodes, in the data paths, e.g. at the input to the ADC. This optimal level is usually determined in accordance with pre-defined criteria. Such criteria are based on system requirements and the characteristics of the circuits receiving the signal whose gain is controlled. If the signal is an analog signal to be converted into a digital signal for subsequent digital data processing, for example, by passing it through an Analog-to-Digital converter (ADC), the role of the AGC unit may be ensuring that the amplitude of the signal delivered to the ADC input utilizes a desired portion of the input dynamic range of the ADC. Conventionally, the amplitude of the signal is controlled so that it fully utilizes, but does not exceed, the dynamic range of the ADC. The AGC controlled gain, required to produce this result, is conventionally set by monitoring each sample of the read data signal as it is digitized by the ADC. The AGC is usually set to produce a signal at the ADC input that is close to 100% of the input peak-to-peak saturation level for the ADC, for example 95% of the peak-to-peak saturation level. Setting a gain that produces a smaller signal than 100% of the input peak-to-peak saturation level accommodates some variation in the maximum and minimum signal provided to the ADC.

If the AGC attempted to maintain the ADC input signal at or above 100% of the input peak-to-peak saturation level, then the AGC loop would saturate, i.e., enter a non-linear region of operation having zero or near-zero incremental gain, become open and therefore would be unable to control the ADC input signal amplitude. Under such a scenario, when the ADC input signal amplitude rises to or above 100% of the input peak-to-peak saturation level, the ADC output used to control the signal gain would always be at an output saturation level and would show no variation with changes in the ADC input signal, thus causing the AGC loop to be unable to further respond, or to become open.

By contrast, in this inventor's approach, the AGC monitors a signal after the ADC output and controls the signal amplitude at the ADC input by optimizing the level of the signal delivered to the ADC for reliable detection of zero crossing points for all symbols. Thus, the present concept provides the ability to determine which of the acquired Run Length Limited (RLL) modulation patterns will have amplitudes at the input saturation level of the ADC. Short, low-amplitude, RLL patterns will have sufficient resolution for reliable extraction as a result of having sufficient overall amplitude, while long, high amplitude RLL patterns are allowed to have whatever amplitude results, even at or above the ADC input saturation level. As a result, the read channel has greater ability to correctly extract data, even in the presence of defects or poor writing characteristics. Moreover, aspects of this inventor's approach include determining correct AGC settings responsive to measurements of non-predetermined user data written without special patterns other than to carry the user's intended information. Yet other aspects of this inventor's approach include detecting and correcting for DC offsets in the signal whose gain is controlled. In general, according to aspects of this inventor's approach, the system monitors a signal representative of the quality of the complete or partial decoding or extraction of information from an input signal, and controls one or more input signal parameters, such as the input signal amplitude, zero-crossing position, symmetry, bandwidth, etc., responsive to the quality monitored.

According to one aspect of one embodiment of the invention, a method of controlling a gain applied to a data signal is provided. The method comprises: measuring a metric of extraction quality of a plurality of symbols extracted from the data signal; periodically determining in response to the metric of extraction quality, a gain to be applied to the data signal to increase the extraction quality; and applying the periodically determined gain to the data signal. The method may further comprise: measuring amplitudes of plural symbols extracted from the data signal; determining, in response to the measured amplitudes and to which plural symbols are extracted, a desired overall amplitude level; periodically determining, in response to the measured amplitudes, the gain to be applied to the data signal to produce the desired overall amplitude level; and periodically adjusting the gain to the determined gain. The method may yet further include digitizing the data signal, wherein measuring amplitudes of plural symbols further comprises: measuring amplitude resolutions of samples comprising the plural symbols.

In another variation of the method, measuring the metric of extraction quality includes measuring how long a time the data signal is at an upper saturation level, and how long a time the data signal is at a lower saturation level, and the method further comprises: applying a DC bias to the data signal to re-bias the data signal so that the data signal is at the upper saturation level and at the lower saturation level for substantially equal times.

According to any of the forgoing variations, the source of the data signal may be an optical storage medium. The optical storage medium may be one of a CD, DVD, HD-DVD, a Blu-Ray disk or other commercially available replicated or recordable optical media.

Some further variations are now discussed. The determination of the desired overall amplitude level occurs during a first plurality of symbols and the periodically adjusting of the gain occurs during a second, subsequent, plurality of symbols responsive to periodically determining the gain to be applied. The method may yet further comprise creating a histogram of the distribution of the plural symbols extracted from the data signal. If the source of the data signal is an optical storage medium, the optical storage medium may be recorded or embossed with a bit length and read back using a laser having a spot size. The method may then further comprise setting the desired overall amplitude level of the plurality of symbols to have amplitudes at a level according to a relationship between the bit length and the spot size. The data signal may include a plurality of data patterns, and the method may further comprise: determining the average amplitude of each data pattern; determining the frequency of occurrence of each data pattern; and determining, in response to the data pattern amplitudes and frequencies, a preferred overall amplitude to be applied to the data signal. This method may yet further comprise: digitizing the data signal, wherein measuring amplitudes of plural symbols further comprises measuring amplitude resolutions of samples comprising the plural symbols, wherein determining the average amplitude of each data pattern further comprises determining the average amplitude resolution of each data pattern, and wherein determining a preferred overall amplitude further comprises determining a preferred overall amplitude resolution.

The method may further comprise: determining for how long a time the data signal exceeds an upper threshold and for how long a time the data signal exceeds a lower threshold; and applying a DC bias signal to the data signal to re-bias the data signal so that the data signal exceeds the upper threshold and the lower threshold by substantially equal amounts of time. Indeed, the determination and application of a DC bias signal may be combined with any other aspects of the invention desired, for example, in order to ensure that the amplitude or amplitude resolution of the symbol and which symbol was observed can be correctly determined. Obtaining the information needed to determine and apply a DC bias can be a by-product of measuring amplitude or amplitude resolution and determining the observed symbol.

In yet another variation, the data patterns are run length limited patterns. The method may include building a histogram of the data patterns. The data signal may carry non-predetermined information content. That non-predetermined information content may be user data.

According to another aspect of an embodiment of the invention, an apparatus for determining a preferred average pattern amplitude resolution to be applied to a data signal comprising a plurality of data patterns, comprises: a pattern amplitude meter for determining an average amplitude for each data pattern of the plurality of data patterns; a pattern histogrammer in communication with the pattern amplitude meter for determining the frequency of occurrence of each data pattern of the plurality of data patterns; and a gain control circuit in communication with the pattern amplitude meter and the histogrammer for determining, in response to the determining of the pattern amplitude meter and the determining of the histogrammer, a preferred average pattern amplitude resolution to be applied to the data signal.

According to yet another aspect of an embodiment of the invention, an apparatus for determining a preferred gain to be applied to a data signal including a plurality of data patterns, comprises: means for determining the average amplitude of each data pattern of the plurality of data patterns; means for determining the frequency of occurrence of each data pattern of the plurality of data patterns; and means for determining a preferred gain to be applied to the data signal based on the determined average amplitude and frequency of occurrence of each data pattern of the plurality of data patterns.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving", and variations thereof herein, is meant to encompass the items listed thereafter and equivalents thereof as well as additional items.

Aspects of the invention are now illustrated with reference to an embodiment described below. This illustrative embodiment, which is exemplary and not limiting, is for an AGC unit incorporated in an optical disk drive read channel. Optical disks are read by directing a laser beam onto a surface having information represented thereon as variations in reflectivity. Those variations in reflectivity can be produced by writing on the disk with a laser, thus changing an optical property of a data recording layer, for example a data recording layer placed between the top surface of the disk and a reflective layer, or by embossing/stamping techniques used during manufacture, for example, which cause the distance light travels to the disk's reflective layer to change as a function of mark depression depth. When such a technique is employed, light interference techniques based on the relationship between the wavelength of the light in a read back beam and the distance from the disk surface to the reflective layer are employed to make the mark appear either dark or light when read. It will be evident, upon reading the description of this exemplary embodiment, how to apply the principles hereof to other media, including at least other storage media and communication media.

In general, according to aspects of embodiments of the invention, the AGC controls amplitude on the basis of providing a signal having characteristics which optimize the recovery of symbols represented by the signal. That is, when the recovery of symbols represented by the signal is sub-optimal, the AGC adjusts signal amplitude to return the recovery of symbols to an optimal level. This is illustrated by an illustrative embodiment described below.

According to aspects of the illustrative embodiment of the invention, the system monitors a signal representative of the quality of the complete or partial decoding or extraction of information from an input signal, and controls one or more input signal parameters, such as the input signal amplitude, zero-crossing position, symmetry, bandwidth, etc., responsive to the quality monitored. In the case of a system in which an AGC controls the input signal amplitude, the AGC sets a gain that results in a signal amplitude producing optimal recovery of information from the input signal. In systems employing RLL encoding, short RLL pattern symbols, which have low amplitudes relative to longer RLL pattern symbols, will have resulting amplitudes that produce sufficient resolution for reliable data extraction, even including those times when those short RLL pattern symbols follow or precede longer RLL pattern symbols, which have high amplitudes relative to shorter RLL pattern symbols. Although longer RLL pattern symbols may, as a result, exceed the input saturation level, doing so does not degrade recovery of the recorded, embossed or stamped information because doing so does not distort the locations of the edges of the pulses, and shorter RLL pattern symbols have sufficient amplitude and resolution to significantly strengthen the ability of the read channel to correctly extract data. The use of RLL pattern symbols is not a limitation of the invention, but is mentioned as one example of the pattern symbols which may be represented in the input signal. The AGC unit measures the quality of recovered pattern symbols and adjusts the amplitude for highest quality data extraction.

The recovered pattern symbol quality may be measured using any of a variety of parameters measured at various points in the read data path. One indication of pattern symbol quality is the percentage of ADC output samples that are at a saturation level. Other indications of recovered pattern symbol quality include the resolution achieved for particular-length RLL symbols, zero crossing point jitter and the frame error rate (FER) returned by the error correcting code (ECC) system. Each of these indications of quality is quantified, so that the gain of a Programmable Gain Amplifier (PGA) can be adjusted, responsive to the indication of quality, so as to improve the value of the indication of quality. The PGA gain can be periodically, intermittently or continuously adjusted, thereby producing an ADC input amplitude that gives the best indication of quality on a substantially continuous basis. Alternatively, another parameter of the input signal can be modified by a suitable signal processing block used in place of or in conjunction with the PGA.

Figure 4:
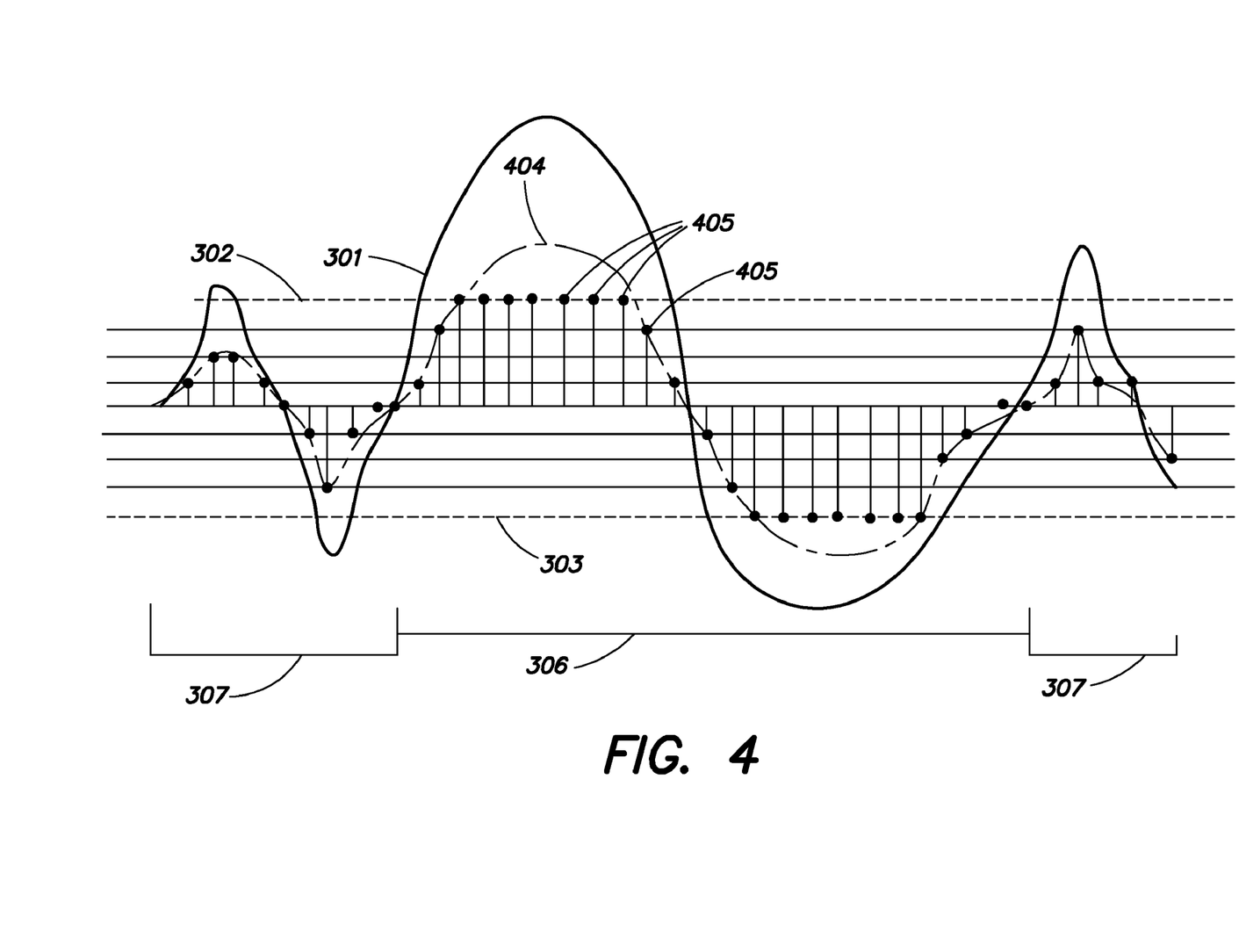
FIG. 4 is an illustration of the input and output signals of an optical disk storage AGC system in accordance with the invention.

The effect of the illustrative AGC system on a signal is shown in the illustrative example of FIG. 4. The same input signal, 301, as used in the example of FIG. 3 is determined by the illustrative AGC to exceed the same upper and lower input saturation levels, 302 and 303. The illustrative AGC lowers the gain of a PGA through which the input signal, 301, passes, producing the output signal, 404. The output signal, 404, of the PGA exceeds the saturation levels, 302 and 303, for some pattern symbols, particularly the longer, higher amplitude patterns. Preferably, in the illustrative AGC, the output signal, 404, is amplified by a sufficient amount so that the sampled values, 405, of longer pattern symbols, 306, which have high amplitudes, are at the output saturation level, 302, but the output signal, 404, is amplified by an amount that does not result in all pattern symbols producing samples at the output saturation level. The resulting signal, comprised of sampled values, 405, has sufficient resolution to adequately represent shorter pattern symbols, 307, which have substantially lower amplitudes. The gain of the PGA is selected to optimize the resolution and accuracy of, for example by interpolation, where zero-crossing points in the input signal 301 are located for all symbol lengths and amplitudes. The signal measured to determine the optimal gain is the non-predetermined user data actually being recovered by the system. Thus, the gain compensates for all effects of the writing, stamping or manufacturing conditions, the reading conditions and the disk conditions.

An exemplary process that controls the PGA gain works as follows:

According to one aspect of the exemplary embodiment, the number of ADC output samples at the upper or lower range limit for the ADC, i.e., at an upper or lower output saturation level, 302, 303, is counted during a specified interval, referred to as a window. For example, for an unsigned 8-bit ADC, the number of samples having values of either 0 or 255 is counted, i.e., at the lower or upper output saturation level. Then, the number of samples observed to be at either saturation level is compared to a number of samples desired to be observed at either saturation level. How to select the number of samples desired to be observed at a saturation level is explained below. If there is a difference between the number of samples observed to be at either saturation level and the number of samples desired to be at either saturation level, the PGA gain is adjusted. For example, if the number of samples observed to be at either saturation level is fewer than desired, the gain could be increased; while if the number of samples observed to be at either saturation level is greater than desired, the gain could be decreased.

The characteristic measured here, i.e., how many samples are observed to be at either saturation level, is one metric of how well RLL symbols will be decoded. The quality of the decoded symbols is best when the number of samples observed to be at a saturation level and the number of samples desired to be at a saturation level is equal. Other metrics could be used, as well, including for example, the resolution achieved for particular-length RLL symbols, the zero crossing point jitter and the frame error rate (FER) returned by the error correcting code (ECC) system.

In accordance with aspects of this exemplary embodiment, the number of samples desired to be at either saturation level varies with another characteristic of the signal, namely the distribution of extracted symbol pulse widths observed within a window of time. The relationship between the distribution of pulse widths observed within a window and the number of samples desired to be at either saturation level may be stored as a formula, table or using any other suitable mechanism. The magnitude by which to adjust the gain as a function of the possible observed differences can also be stored as a formula, table or using any other suitable mechanism. Other suitable mechanisms can include hardware or software mechanisms or combinations thereof.

Figure 5:
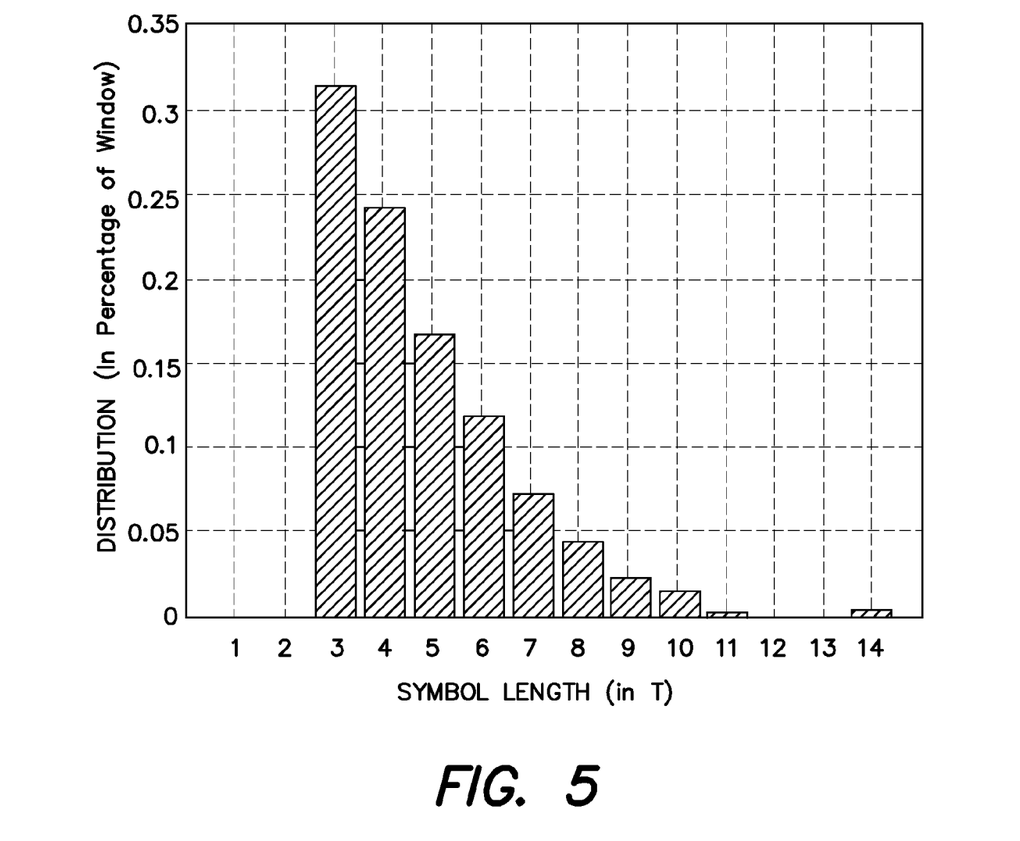
FIG. 5 is a histogram illustrating DVD data used by the systems and apparatuses of the invention to implement the methods described herein.

In this exemplary embodiment, a histogram of the distribution of extracted symbol pulse widths, after being retimed to the channel bit rate, observed within a window of time that continuously moves forward in time during processing of the signal is maintained. The histogram (see FIG. 5) of the extracted readout signal is built depicting frequency of observation of each possible RLL pattern, i.e., each possible pulse width, by an RLL histogram circuit. The histogram provides the distribution of appearances of each possible symbol normalized to the size of the window. The possible symbol pulse widths for conventional DVD media are pulse widths of 3 T-11 T and 14 T. The possible symbol pulse widths for conventional CD media are pulse widths of 3 T-11 T.

Samples produced at the output of the ADC are observed during a window of a given size. The size of the window may be selected to adjust the response time of the AGC system. For example, the size of the window may be hundreds of samples, as compared to the hundreds of channel bit lengths over which conventional AGCs measure and react. This enhances the ability of the system to recover data from a locally sub-optimal portion of the media, due for example, to the presence of scratches, fingerprints, or smudges on the media which are longer than the AGC response time. In one embodiment, the size of the window may be set via software to provide flexibility. The desired number of samples observed to be at a saturation level is determined with reference to the observed frequency of occurrence information for each RLL pattern in a field of non-predetermined user data to be recovered or any other field of data to be recovered. The representation of the desired number of samples at a saturation level can be implemented in either hardware (HW) or software (SW) depending on the required response time and level of flexibility desired. Tables, specialized HW or SW logic or algorithmic computation methods can be used to compute the desired number of samples for each possible histogram of observed RLL pattern frequencies of occurrence. For instance, one way of establishing the representation could be the following two acts:

(1) Determine a priori, the desired amplitude resolution of valid data patterns that are below saturation. For example, in a conventional DVD recorder, the designer may decide a priori on the required highest sample amplitude resolution of 3 T and 4 T patterns. Because 3 T patterns have the lowest maximum sample amplitude when reproduced, and therefore need to be set for a minimum resolution suitable for reliable reproduction, those patterns are the focus of this exemplary method. In other technologies, for example those using 2 T patterns, those could be the focus of this act. The relative maximum sample amplitudes of different length patterns are in a predetermined relationship for a given disk and reproduction system. Therefore, depending on the resolution desired for 3 T (or other length) patterns, some longer, higher amplitude patterns may cause the ADC output to reach saturation level. Setting the maximum sample amplitude of the lowest-amplitude pattern to a desired value thus sets the amplitudes of all the patterns, even if those amplitudes exceed, for some number of samples in each of the pattern symbols, the level causing saturation of subsequent elements in the read path.

(2) By looking into the measured or collected histogram of the distribution of extracted symbol pulse widths, after being retimed to the channel bit rate, the desired number of samples in a defined window that are at saturation level can now be computed. For example, for the longer pattern symbol 306 in FIG. 4, the desired number of samples at the upper saturation level may be seven of the 25 samples forming the longer pattern signal. For the shorter pattern symbols 307, the desired number of samples at the upper (or lower) saturation level would be zero. For each RLL pattern, this act takes the expected number of samples which will reach the saturation level and multiplies that number of samples by the expected number of occurrences of the RLL pattern within a window of observation. Deciding upon a resolution determines which patterns of a distribution should reach the saturation level. Deciding upon a resolution also determines how many samples of each pattern which reaches the saturation level should reach the saturation level. By multiplying the number of patterns in the distribution that, based on the decided-upon resolution, should reach the saturation level, by the number of samples for each of these patterns that, based on the decided-upon resolution, should reach the saturation level, the number of samples desired to be saturated in the upcoming window can be found. The histogram is collected over a window of observation, as explained above, that slides forward in time as data is recovered. Thus, the times at which observed pattern symbols are collected, are maintained, and when a new RLL pattern is added to the front of the window of observation included in the histogram, the oldest RLL pattern is dropped out of the window and removed from the histogram.

The above two acts sets the desired number of samples to produce a desired resolution of 3 T pattern symbols. The desired resolution may be selected according to the following discussion.

In conventional DVD systems, the diameter of the laser beam used to read signals from the disk surface is about 4.6 T. While there are ten permissible patterns representing symbols in conventional DVD systems, including the sync pattern, there are fewer than ten different amplitudes corresponding to those permissible patterns. For such a system, it may be desirable to set the gain so that 5 T signals just reach the input peak-to-peak saturation level of the ADC. Working backward, and knowing the relationships between permissible RLL patterns and relative amplitudes, the resolution of the 3 T pattern symbols (or alternatively the 4 T pattern symbols) can be selected. Embodiments of aspects of the invention are adaptable to variation in the exact beam diameter, the set of permissible patterns and the channel bit length, T, such as the variations expected as new technologies develop, including, but not limited to Blu-Ray and HD-DVD technologies.

As an additional benefit of the present concept, the measurement of the number of samples at both upper and lower ADC saturation levels provides a mechanism to obtain a measurement of, and correct for, any possible RF signal asymmetry. For example, if the playback RF signal suffers from asymmetry, the retiming and equalization performed by a finite impulse response (FIR) filter will distort the zero crossing point, which determines the spacing defining information-carrying symbols in the signal, and may be used as the phase Lock Loop (PLL) phase error signal. Therefore, correcting for the effects of RF signal asymmetry further improves read channel data extraction capability.

According to this aspect of the described embodiment, the sampled signal (FIG. 2, 204) is connected to the AGC Circuit (FIG. 2, 217), as described below. The AGC Circuit computes the difference in number between samples at the upper saturation level and samples at the lower saturation level. The AGC Circuit then controls a re-biasing circuit (not shown) to re-bias the readout signal at some point before it is digitized by the ADC. The re-biasing circuit could be incorporated in the PGA (FIG. 2, 201), for example.

As a result of proper gain control and adjusting DC bias, a lower resolution ADC can be used, lower cost disks can be used, and less precise writing and reading apparatus can be used, while still ensuring reliability and interchangeability. This is a substantial cost savings, making aspects of the invention well suited for use in consumer commodity goods where cost is a significant factor, as well as other uses.

One exemplary embodiment for setting the gain of the AGC at a level to produce a desired output signal quality level has been described in connection with measuring sample amplitudes after conversion by an ADC and comparing the number saturated to a desired or expected number saturated. Alternative methods are now described, which use a Pattern Amplitude Meter (FIG. 2, 212) to determine signal quality at a point after the signal is partially recovered by measuring pattern symbol amplitudes and comparing the average amplitude resolution to a desired average amplitude resolution. The alternative methods are described in connection with RLL pattern symbols whose amplitudes are measured using an RLL Patterns Amplitude Meter and whose frequency of occurrence are measured using an RLL Histogrammer, but the invention is not limited to RLL pattern symbols, as other encoding methods may be used.

Figure 2:
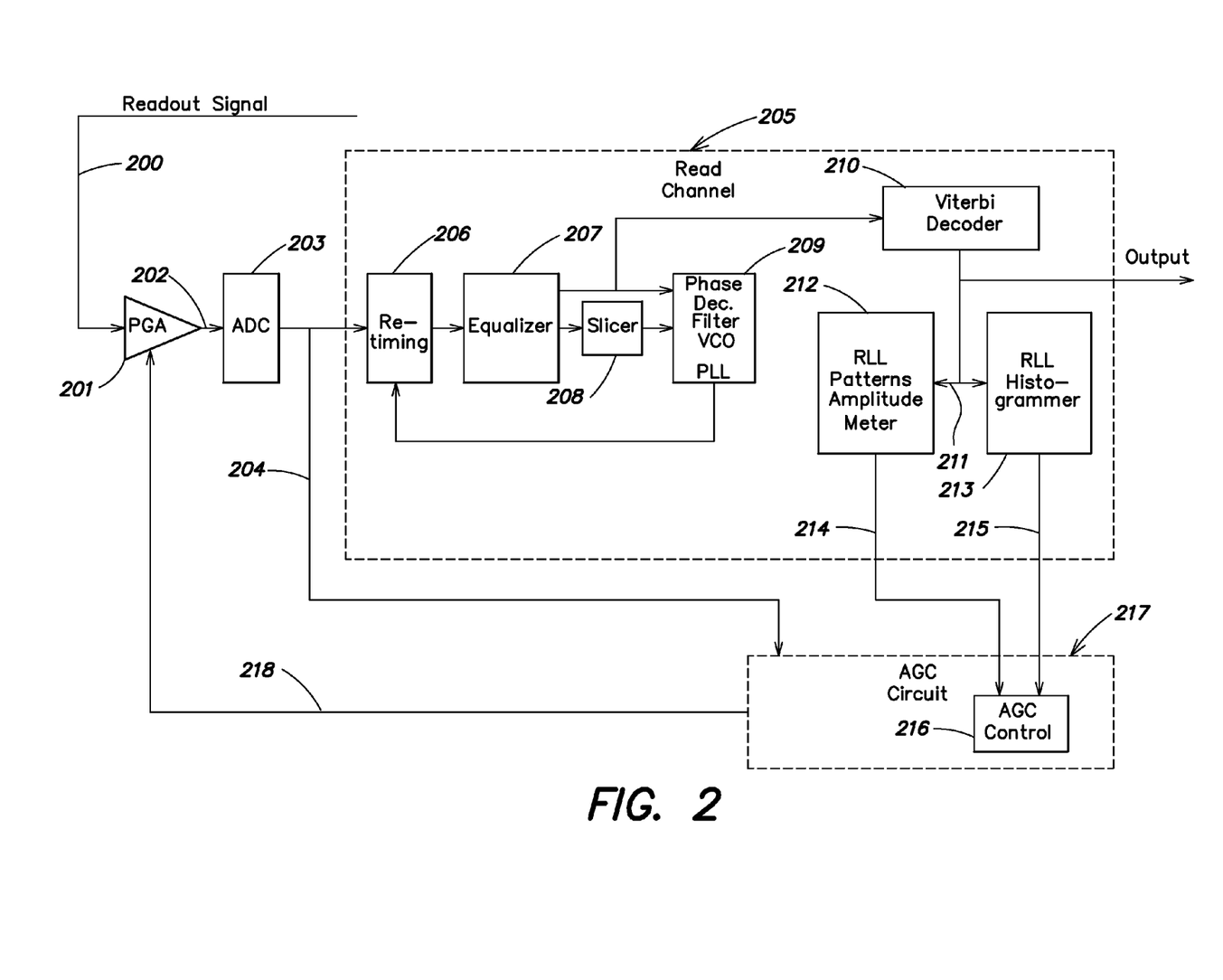
FIG. 2 is block diagram of one possible architecture of an optical disk storage read channel and automatic gain control (AGC) in accordance with the invention.

In one method, the RLL Patterns Amplitude Meter, 212, may be programmed or configured to measure the amplitude resolution of only 3 T patterns, or some other desired pattern. In this case, the AGC Control, 216, then sets a gain that produces a desired average amplitude resolution for the 3 T patterns actually recovered.

According to another embodiment of the invention, the designer determines what amplitude resolution is desired for one or more possible detected patterns. For example, for use with conventional DVD media, according to this aspect of the present invention, a target resolution that assures consistently adequate 3 T pattern extraction may be selected. The amplitude resolutions for the remaining patterns, 4 T-11 T and 14 T are allowed to take on whatever values they may. During operation, the pattern symbols are recovered and the amplitude of each pattern within a time window of predetermined length is measured by the Patterns Amplitude Meter, while a histogram of pattern occurrences is formed by an RLL Histogrammer (FIG. 2, 213).

The histogram is used together with the amplitude resolution selected for 3 T patterns, and hence for all patterns, to compute a desired average amplitude for the patterns actually recovered. An overall average is computed as if each pattern occurrence had the amplitude resolution determined by setting the 3 T patterns to its desired amplitude resolution.

The average amplitude resolution of the detected patterns is then compared by the AGC Control (FIG. 2, 216) to the desired average amplitude resolution just computed. If the average measured amplitude resolution is higher than that desired, then the gain of the PGA is reduced, while if the average measured amplitude resolution is lower than that desired, then the gain of the PGA is increased. For use in conventional DVD systems, embodiments of the present invention use the 3 T pattern to set the overall average amplitude because it has the smallest amplitude. If a larger amplitude pattern were used, the AGC loop could open up and become non-reactive due to the measured amplitude always being in saturation, regardless of the AGC gain setting.

The average amplitude of each pattern (3 T-11 T, both marks and spaces) can be measured by an RLL patterns amplitude meter circuit, as explained above. In the topology described further in detail below, one optional way to obtain these measurements is shown, utilizing the information obtained at the output of a Viterbi decoder, including the adjacent channel bits polarity. The Viterbi algorithm is one of several methods used to identify sequences of symbols in the read signal.

A topology suitable for implementing aspects of the illustrative methods described above is now discussed in connection with FIG. 2.

An input, in this example the Readout Signal, 200, is received by the PGA, 201. The output of the PGA, 201, is an amplitude controlled signal, 202, whose amplitude has been adjusted to that amplitude which produces the desired number of samples at a saturation level in a window according to one possible metric of extraction quality described above. The amplitude controlled signal, 202, is then applied to the input of the ADC, 203, which digitizes the amplitude controlled signal, 202. The digitized readout signal, 204, produced by the ADC is the input to the Read Channel, 205, and to the AGC circuit, 217. The Read Channel, 205, may include a suitable arrangement of read channel blocks including a Retiming block, 206, which performs a conversion of the signal sample rate from the ADC sampling rate to the channel bit rate, and Equalizer, 207, a slicer, 208, a phase-locked loop circuit, 209, and a Viterbi decoder, 210. Executing the Viterbi algorithm on the digitized readout signal, 204, after it has been appropriately retimed and equalized, allows the information contained in the digitized readout signal to be identified and recovered.

In addition to decoding the information for recovery, the Viterbi decoder produces a decoded output, 211, that may, in certain embodiments, be measured by both an RLL Patterns Amplitude Meter, 212, and an RLL Histogrammer, 213. The amplitudes of the various RLL pattern symbols, 214, produced by the RLL Patterns Amplitude Meter, 212, together with the histogram, 215, produced by the RLL Histogrammer, 213, are applied to the AGC Control, 216. The AGC Control, 216, part of the AGC Circuit, 217, controls the gain of the PGA 201 to the desired level, according to one of the methods described above, to achieve a desired recovered signal quality. The RLL Patterns Amplitude Meter communicates pattern amplitudes measured, 214, to the AGC Control, 216, and the RLL Histogrammer communicates the distribution of patterns, 215, to the AGC Control, 216. The AGC Control, 216, then computes a new gain command, 218 to communicate to the PGA, 201. The AGC Control, 216, may also use information from the sampled signal, 204, as described above.

The system may also effect AGC control using information from the sampled signal 204, as now described. The ADC output, 204, is fed to AGC circuit 217 substantially without processing so that the number of samples at the upper saturation level can be compared to the number of samples at the lower saturation level. An element ahead of the ADC circuit, 203, for example an offset DAC (not shown; may be part of the PGA, 201), can then re-bias the signal, so that the input signal to the ADC, 202, is better centered between the input saturation levels of ADC, 203.

The embodiments of aspects of the invention described above observe and measure at least amplitude and occurrence information obtained from a signal containing non-predetermined information content, particularly user data, unlike the known art, such as U.S. Patent Application No. 2003-0079161A1 mentioned above. According to U.S. Patent Application No. 2003-0079161A1, a special, known pattern is written to the disk to provide the AGC system disclosed with a signal having predetermined information content. Embodiments of the present invention adjust the nature of the measurement used dynamically to accommodate any arbitrary data pattern without a priori knowledge of the pattern.

Next generation optical disk media such as the high definition Blu-Ray format from Sony/Philips and the HD-DVD format from Toshiba, and similar advanced media systems such as joint efforts of the Blu-Ray and HD-DVD teams, also employ RLL channel code modulation schemes. Therefore the illustrated concept can be applied to Blue-Ray and HD-DVD technology as well as the recently proposed combination of these two format and other formats that may be contemplated in the future. In the case of Blu-Ray, which employs high density recording and the 17 PP modulation technique, the minimum length mark is 2 T resulting in high inter-symbol interference (i.e., low signal-to-noise ratio) and lower 2 T pattern amplitudes. In this case, the dominant error scenario will be that the 2 T pattern will be decoded as a 3 T pattern and vice versa. Applying the illustrated AGC concept with quality analysis of the recovered symbols will strengthen the 2 T pattern amplitudes without sacrificing the data extraction performance.

The illustrated concept can readily be generalized to applications in any communication channel that benefits from use of an AGC as shown. In this regard, recording media may be thought of as specialized communication channels in which information may be delayed for a period of time while it resides on the medium. As such, aspects of the invention may be applied to recording media or communications channels to monitor a signal representative of the quality of the complete or partial decoding or extraction of information from an input signal, and may control one or more input signal parameters, such as the input signal amplitude, zero-crossing position, symmetry, bandwidth, etc., responsive to the quality monitored.

Having thus described several aspects of at least one embodiment of this invention, it is to be appreciated that various alterations, modifications, and improvements will readily come to mind to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of controlling a gain applied to a data signal, the method comprising:
  receiving the data signal as a continuous, time-varying, analog amplitude forming a sequence of waveforms representing a plurality of symbols and the plurality of symbols representing a plurality of informational values carried by the data signal;
  digitizing the data signal to form a time sequence of signal amplitude values;
  extracting the plurality of symbols from the time sequence of signal amplitude values;

measuring a metric of extraction quality of the plurality of symbols extracted from the data signal, extraction quality representing how accurately symbols are extracted from the data signal;

periodically determining in response to the metric of extraction quality, a gain to be applied to the data signal to increase the extraction quality; and applying the periodically determined gain to the data signal.

2. The method of claim 1, further comprising:

measuring amplitudes of plural symbols extracted from the data signal;

determining, in response to the measured amplitudes and to which plural symbols are extracted, a desired overall amplitude level;

periodically determining, in response to the measured amplitudes, the gain to be applied to the data signal to produce the desired overall amplitude level; and periodically adjusting the gain to the determined gain.

3. The method of claim 2, further comprising digitizing the data signal, wherein measuring amplitudes of plural symbols further comprises:

measuring amplitude resolutions of samples comprising the plural symbols.

4. The method of claim 1, wherein measuring includes measuring how long a time the data signal is at an upper saturation level, and how long a time the data signal is at a lower saturation level, the method further comprising:

applying a DC bias to the data signal to re-bias the data signal so that the data signal is at the upper saturation level and at the lower saturation level for substantially equal times.

5. The method of claim 2 wherein the source of the data signal is an optical storage medium.

6. The method of claim 5 wherein the optical storage medium is one of a CD, DVD, HD-DVD and a Blu-Ray disk.

7. The method of claim 2 wherein the determination of the desired overall amplitude level occurs during a first plurality of symbols and the periodically adjusting the gain occurs during a second, subsequent, plurality of symbols responsive to periodically determining the gain to be applied.

8. The method of claim 2 further comprising creating a histogram of the distribution of the plural symbols extracted from the data signal.

9. The method of claim 8 wherein the source of the data signal is an optical storage medium.

10. The method of claim 9 wherein the optical storage medium is recorded or embossed with a bit length and read back using a laser having a spot size, further comprising:

setting the desired overall amplitude level of the plurality of symbols to have amplitudes at a level according to a relationship between the bit length and the spot size.

11. The method of claim 9 wherein the optical storage medium is one of a CD, DVD, HD-DVD and a Blu-Ray disk.

12. The method of claim 2, wherein the data signal includes a plurality of data patterns, the method comprising:

determining an average amplitude of each data pattern;

determining a frequency of occurrence of each data pattern; and determining, in response to the determined data pattern amplitude of each data pattern and the determined frequency of occurrence of each data pattern, the desired overall amplitude level to be applied to the data signal.

13. The method of claim 12, further comprising:

digitizing the data signal, wherein measuring amplitudes of plural symbols further comprises measuring amplitude resolutions of samples comprising the plural symbols, wherein determining the average amplitude of each data pattern further comprises determining the average amplitude resolution of each data pattern, and wherein determining the desired overall amplitude level further comprises determining a preferred overall amplitude resolution.

14. The method of claim 12, further comprising:

determining for how long a time the data signal exceeds an upper threshold and for how long a time the data signal exceeds a lower threshold; and applying a DC bias signal to the data signal to re-bias the data signal so that the data signal exceeds the upper threshold and the lower threshold by substantially equal amounts of time.

15. The method of claim 12 wherein the source of the data signal is an optical storage medium.

16. The method of claim 15 wherein the optical storage medium is one of a CD, DVD, HD-DVD and a Blu-Ray disk.

17. The method of claim 12 wherein the data patterns are run length limited patterns.

18. The method of claim 12 further comprising building a histogram of the data patterns.

19. The method of claim 2 wherein the data signal is carrying non-predetermined information content.

20. The method of claim 19, wherein the non-predetermined information content is user data.

21. A method of controlling extraction quality of a data signal, the method comprising:

receiving the data signal as a continuous, time-varying, analog amplitude forming a sequence of waveforms representing a plurality of symbols and the plurality of symbols representing a plurality of informational values carried by the data signal;

digitizing the data signal to form a time sequence of signal amplitude values;

extracting the plurality of symbols from the time sequence of signal amplitude values;

measuring a metric of extraction quality of the plurality of symbols extracted from the data signal, extraction quality representing how accurately symbols are extracted from the data signal;

periodically determining in response to the metric of extraction quality, a value of a parameter affecting the extraction quality of the data signal to be applied to the data signal to increase the extraction quality; and applying the periodically determined value of the parameter to the data signal.

22. The method of claim 21, wherein the value of the parameter affects at least one of amplitude, zero-crossing position, symmetry, and bandwidth of the data signal.

23. The method of claim 22, wherein the value of the parameter is a gain applied to the data signal before extracting the plurality of symbols from the data signal.

24. The method of claim 22, wherein the value of the parameter is an offset applied to the data signal before extracting the plurality of symbols from the data signal.

25. An apparatus for controlling extraction quality of a data signal from which symbols are extracted by a data extraction circuit, the apparatus comprising:

an input connected to receive the data signal as a continuous, time-varying, analog amplitude forming a sequence of waveforms representing a plurality of symbols and the plurality of symbols representing a plurality of informational values carried by the data signal;

a digitizer having an input connected to receive the data signal and having an output carrying a time sequence of digitized signal amplitude values;

the data extraction circuit having an input connected to receive the time sequence of digitized signal amplitude values and an output carrying extraction information representing the plurality of symbols extracted;

an extraction quality circuit having an input connected to receive extraction information from the data extraction circuit and having an output carrying a signal representing a metric of extraction quality of a plurality of symbols extracted from the data signal, extraction quality representing how accurately symbols are extracted from the data signal;

a control system connected to the output of the extraction quality circuit, periodically determining in response to the metric of extraction quality, a value of a parameter affecting the extraction quality of the data signal to be applied to the data signal to increase the extraction quality, and having a control system output carrying a control signal; and a data signal processor circuit having an input to which the data signal is applied and having an output from which the data signal with the parameter applied is produced, the data signal processor circuit further having a control input receiving the control signal from the control system output, wherein responsive to the control input, the data signal processor circuit applies the periodically determined value of the parameter to the data signal.

26. The apparatus of claim 25, wherein the value of the parameter affects at least one of amplitude, zero-crossing position, symmetry, and bandwidth of the data signal.

27. The apparatus of claim 26, wherein the value of the parameter is a gain applied to the data signal before extracting the plurality of symbols from the data signal.

28. The apparatus of claim 26, wherein the value of the parameter is an offset applied to the data signal before extracting the plurality of symbols from the data signal.

* * * * *

UNITED STATES PATENT AND TRADEMARK OFFICE
CERTIFICATE OF CORRECTION

PATENT NO. : 7,668,053 B2 Page 1 of 1
APPLICATION NO. : 10/908992
DATED : February 23, 2010
INVENTOR(S) : Bassel Haddad It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1145 days.

Signed and Sealed this

Seventh Day of December, 2010

David J. Kappos
*Director of the United States Patent and Trademark Office*